United States Patent [19]
Kato

[11] Patent Number: 5,914,354
[45] Date of Patent: Jun. 22, 1999

[54] RADIATION-SENSITIVE RESIN COMPOSITION

[75] Inventor: Hideto Kato, Takasaki, Japan

[73] Assignee: Shin-Etsu Chemical Co., Ltd., Tokyo, Japan

[21] Appl. No.: 08/909,871

[22] Filed: Aug. 12, 1997

[30] Foreign Application Priority Data

Aug. 12, 1996 [JP] Japan .................................. 8-229351

[51] Int. Cl.$^6$ .............................. G03F 7/38; C08G 69/26
[52] U.S. Cl. .............................. 522/99; 528/26; 528/170; 528/172; 528/173; 528/185; 528/188; 528/220; 528/229; 528/353; 522/136; 522/137; 525/479; 430/283.1; 430/287; 430/325
[58] Field of Search ............................ 528/26, 353, 170, 528/220, 229, 172, 173, 185, 188; 525/479; 430/287, 325, 283.1; 522/136, 137, 99

[56] References Cited

U.S. PATENT DOCUMENTS

| | | | |
|---|---|---|---|
| 4,515,887 | 5/1985 | Davis | 528/26 |
| 5,041,513 | 8/1991 | Okinoshima et al. | 528/10 |
| 5,587,275 | 12/1996 | Kato | 430/283.1 |
| 5,616,448 | 4/1997 | Kato | 430/283.1 |
| 5,714,572 | 2/1998 | Kato | 528/310 |

*Primary Examiner*—P. Hampton-Hightower
*Attorney, Agent, or Firm*—Oblon, Spivak, McClelland, Maier & Neustadt, P.C.

[57] ABSTRACT

A photosensitive resin composition comprising;

(A) a polyimide precursor containing an acrylic or methacrylic group;

(B) a tertiary amine compound represented by the general formula:

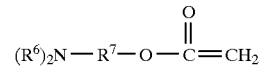

wherein $R^6$ is a monovalent organic group having 3 or less carbon atoms, $R^7$ is a divalent organic group having 3 or less carbon atoms, and $R^8$ is a hydrogen atom or a methyl group; and (C) at least one of a photopolymerization initiator and a sensitizer.

This composition has a sufficient sensitivity even when thick films are formed, has a superior developability in an aqueous alkali solution, and is suited for the formation of polyimide patterns.

14 Claims, No Drawings

RADIATION-SENSITIVE RESIN COMPOSITION

BACKGROUND OF THE INVENTION

1. Field of the Invention

This invention relates to a photosensitive resin composition of a negative type, and more particularly to a photosensitive resin composition that enables formation of a thick film with a high sensitivity and also exhibits a superior developability in an aqueous alkali solution. This also relates to a process for producing a polyimide pattern by the use of such a composition.

2. Description of the Prior Art

As photosensitive materials having thermal resistance, those comprising a polyamic acid and a dichromate (Japanese Patent Publication (kokoku) No. 49-17374 corresponding to U.S. Pat. No. 3,623,870), those formed by ester linkage of a carboxyl group of a polyamic acid with a group having a photosensitivity (Japanese Pre-examination Patent Publication (kokai) Nos. 49-11541 corresponding to U.S. Pat. No. 3,957,512 and No. 55-45746), those comprising a polyamic acid and an amine compound having a photosensitive group (Japanese Pre-examination Patent Publication (kokai) No. 54-145794 corresponding to U.S. Pat. No. 4,243,743), those formed by silyl ester linkage of a carboxyl group of a polyamic acid with a group having a photosensitivity (Japanese Pre-examination Patent Publication (kokai) No. 62-275129), etc. are proposed in the past.

These, however, make it necessary to use organic solvent developing solutions when patterns are formed, and have a problem of some influence on health due to organic solvents and a problem of the disposal of waste liquor.

To cope with such problems, those formed by amide linkage of a carboxyl group of a polyamic acid with a group having a photosensitivity (Japanese Pre-examination Patent Publication (kokai) Nos. 60-100143 corresponding to U.S. Pat. Nos. 4,515,887 and 2,157,845), positive type photosensitive resin compositions comprising a mixture of a polyimide resin having a phenolic group with an ester of naphthoquinonediazidosulfonic acid (Polymer Engineering and Science, July 1989, Vol. 29, 954), etc. are proposed as photosensitive materials making use of aqueous solution developing solutions.

These, however, have problems that they exhibit no sufficient sensitivity when films are formed and also take a long time for development.

SUMMARY OF THE INVENTION

Accordingly, an object of the present invention is to provide a photosensitive resin composition that has a sufficient sensitivity even when thick films are formed, and also can be developed in a short time using an aqueous alkali solution.

As a result of extensive studies, the present inventors have discovered that a composition comprising a specific polyimide precursor, a tertiary amine compound and a photopolymerization initiator and/or a sensitizer can achieve the above object.

More specifically, the present invention provides a photosensitive resin composition comprising:

(A) a polyimide precursor having a repeating unit represented by the general formula (1):

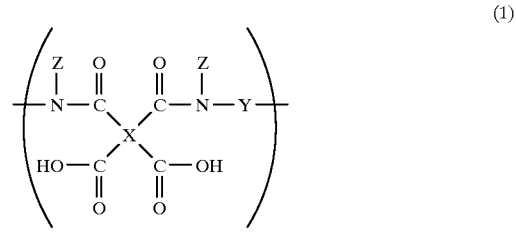

(1)

wherein X is a tetravalent aromatic residual group containing at least 50 mol % of a group selected from the group consisting of groups represented by the formulas (2)-1 to (2)-3 (i.e., a tetravalent organic group having an aromatic ring):

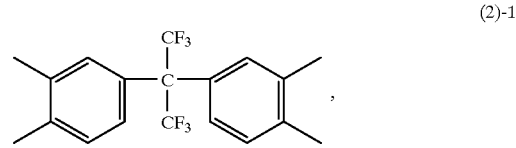

(2)-1

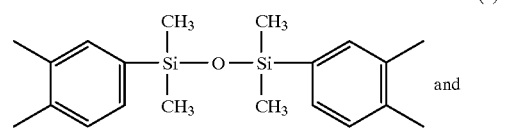

(2)-2 and

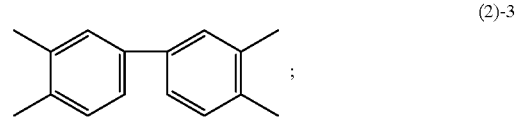

(2)-3

Y is at least one member selected from the group consisting of a divalent organic group having an aromatic ring and a divalent organic group having a siloxane linkage; Z's each consist of from 10 to 80 mol % of a monovalent group represented by the formula (5):

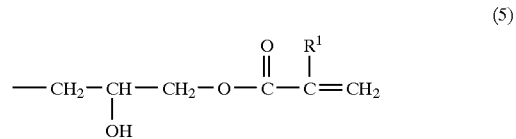

(5)

wherein $R^1$ is a hydrogen atom or a methyl group (i.e., a monovalent group containing a methacrylic group); and from 90 to 20 mol % of a hydrogen atom;

(B) a tertiary amine compound represented by the general formula (8):

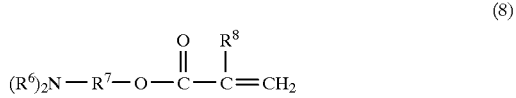

(8)

wherein $R^6$ is a monovalent organic group having 3 or less carbon atoms, $R^7$ is a divalent organic group having 3 or less carbon atoms, and $R^8$ is a hydrogen atom or a methyl group; and (C) at least one member selected from the group consisting of a photopolymerization initiator and a sensitizer.

The present invention also provides a process for producing a polyimide pattern, the process comprising the steps of;

(1) coating a base material with the above composition, followed by drying to form a coating film;
(2) exposing the coating film thus formed, to light through a mask placed thereon;
(3) developing the coating film having been exposed, in an aqueous alkali solution to form a pattern; and
(4) heating the resultant pattern to effect polyimidization.

The photosensitive resin composition of the present invention has a good photosensitivity also in the case of relatively thick films. Also, since the aqueous alkali solution can be used as a developing solution, neither the problem on health nor the problem of the disposal of waste liquor may occur which may accompany the use of organic type developing solutions. As for the development, it can be carried out in a short time and with ease. The photosensitive resin composition of the present invention contains almost no ionic impurities and hence has a superior storage stability.

The pattern formed after development can have a good shape, and the polyimide pattern formed by polyimidization also has a superior adhesion to the base material.

Polyimide cured films or patterns have superior thermal resistance, electrical properties and mechanical properties, and are useful especially in protective insulating films for semiconductor devices, alignment films for liquid-crystal devices, and insulating films for multi-layer printed-circuit boards.

DESCRIPTION OF THE PREFERRED EMBODIMENTS

The present invention will be described below in detail.

Component (A):

The component-(A) polyimide precursor, i.e. polyamic acid, of the present invention is, as described above, constituted of the repeating unit represented by the general formula (1). In the tetravalent organic group having an aromatic ring, represented by X in the general formula (1), the group selected from the group consisting of groups represented by the formulas (2)-1 to (2)-3 comprises at least 50 mol %, and preferably from 70 to 100 mol %. Any of these groups may be used alone or in combination of two or more. If these groups are in an amount less than 50 mol % in total, the resultant resin composition can not have sufficient light-transmission properties, resulting in an insufficient photosensitivity in some cases, and also no sufficient developability in the aqueous alkali solution in some cases.

In the tetravalent organic group having an aromatic ring, represented by X, a group(s) other than the groups represented by the formulas (2)-1 to (2)-3 may be contained, which may include, e.g., the following.

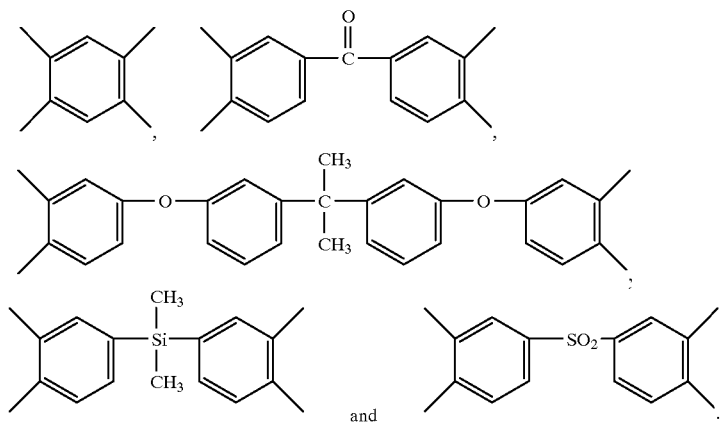

Any of these may be used alone or in combination of two or more.

Y in the general formula (1) is at least one member selected from the group consisting of a divalent organic group having an aromatic ring and a divalent organic group having a siloxane linkage. The divalent organic group having an aromatic ring may include, e.g., groups represented by the formula (3):

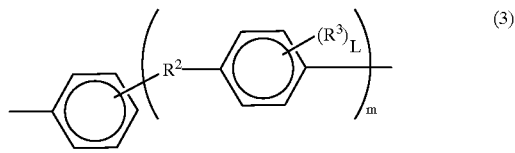

wherein $R^2$ is independently a divalent group —$CH_2$—, —$C(CH_3)_2$—, —$C(CH_3)$—, —$C(CF_3)_2$—, —S—, —$SO_2$— or —O—; $R^3$ is independently a hydrogen atom, a methyl group or a halogen atom; L is 1 or 2; and m is an integer of 0 to 3.

As examples of the divalent organic group having an aromatic ring, it may include groups represented by the following formulas.

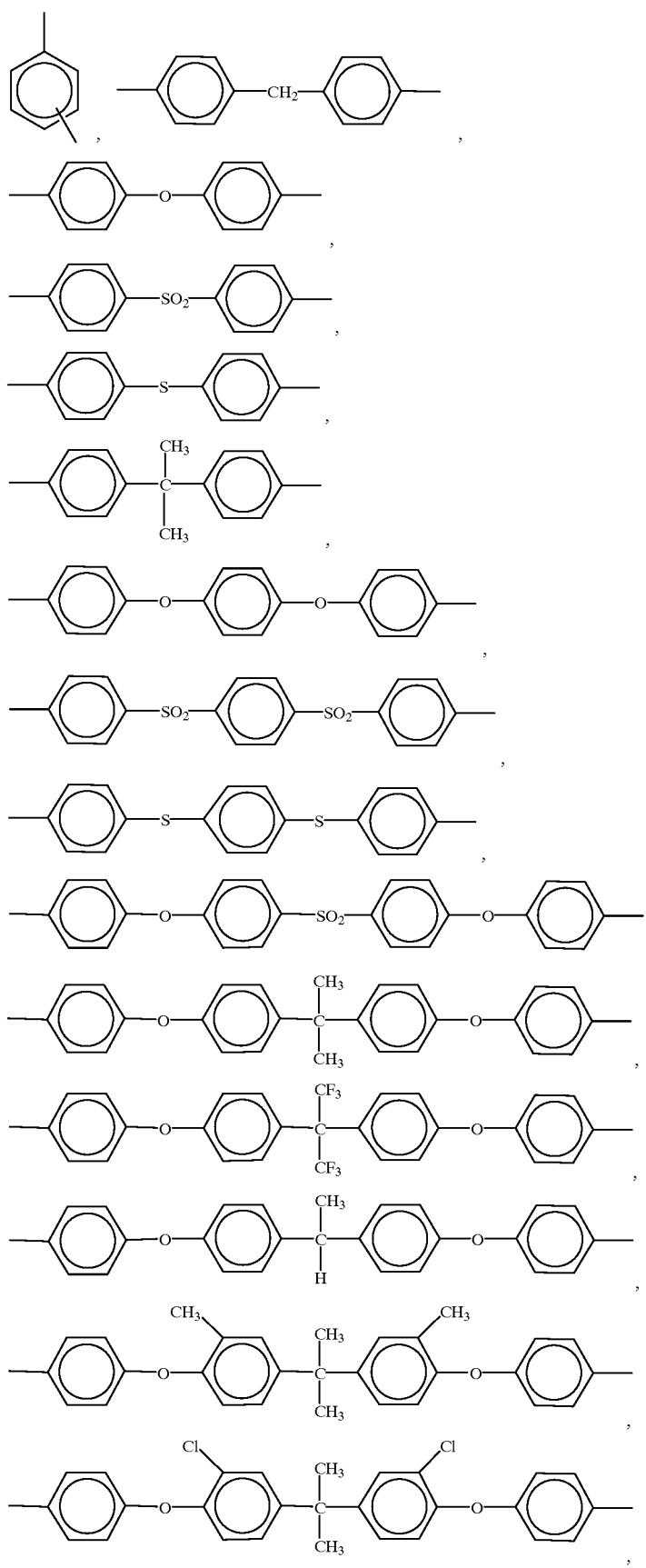

-continued

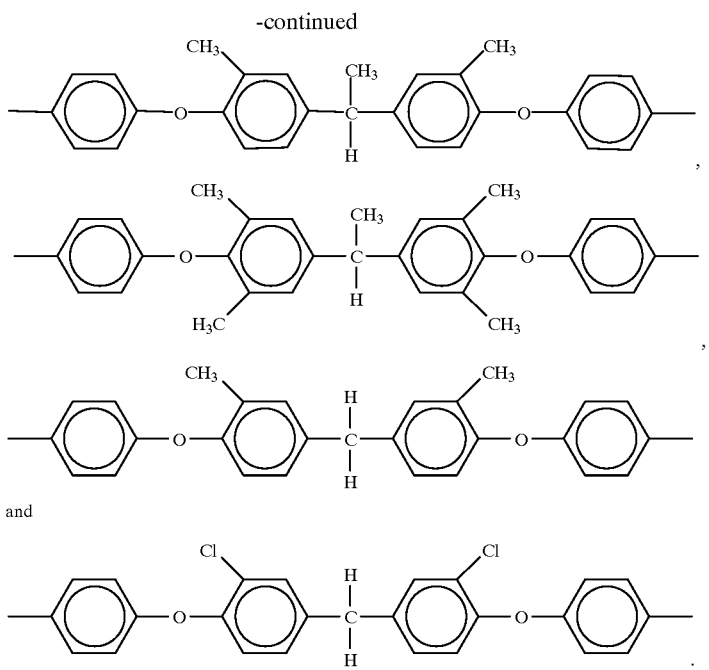
,
,
and
.

It may preferably include those represented by the following formulas.

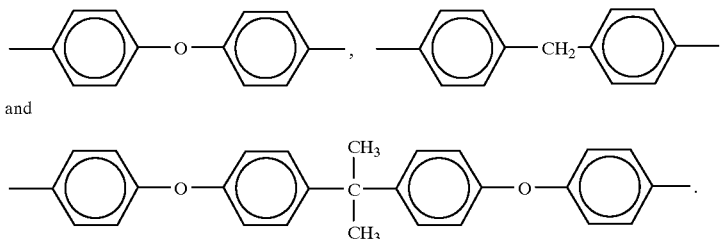
,
and
.

Any of these may be present alone or in combination of two or more.

The divalent organic group having a siloxane linkage may include, e.g., groups represented by the general formula (4):

$$-R^4-\underset{\underset{R^5}{|}}{\overset{\overset{R^5}{|}}{Si}}-(O-\underset{\underset{R^5}{|}}{\overset{\overset{R^5}{|}}{Si}})_n-R^4- \quad (4)$$

wherein $R^4$'s are each a divalent organic group, $R^5$'s are each a divalent hydrocarbon group, and n is an integer of usually from 1 to 20 and preferably from 1 to 10.

The divalent organic group represented by $R^4$ includes, e.g., an alkylene group having 1 to 4 carbon atoms such as a methylene group, an ethylene group, a trimethylene group or a propylene group, and groups represented by the following formulas:

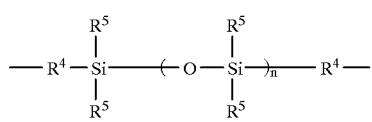
and

It may preferably be a propylene group.

The divalent hydrocarbon group represented by $R^5$ includes, e.g., an alkyl group having 1 to 3 carbon atoms such as a methyl group or an ethyl group, and an aryl group such as a phenyl group. It may preferably be a methyl group or a phenyl group.

As examples of the divalent organic group having a siloxane linkage, it may include groups represented by the following formulas.

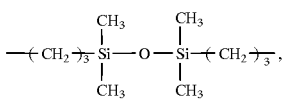
,

-continued

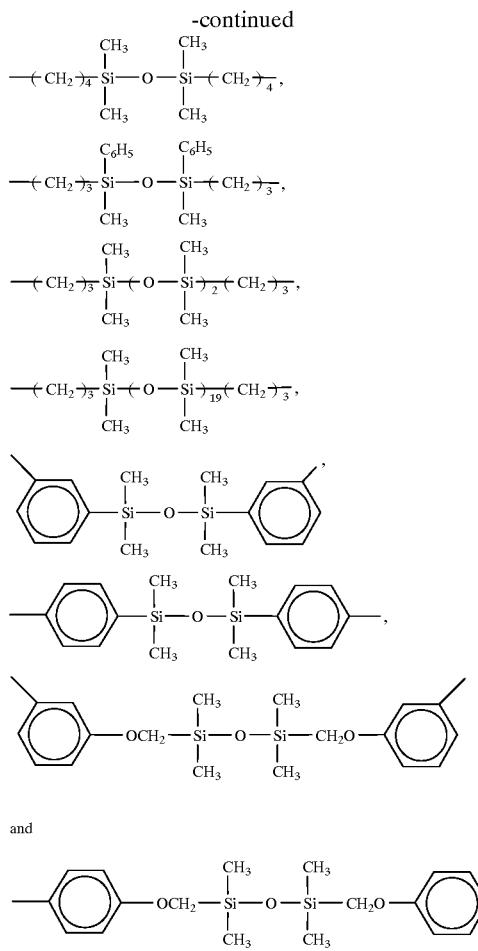

It may preferably include groups represented by the following formulas.

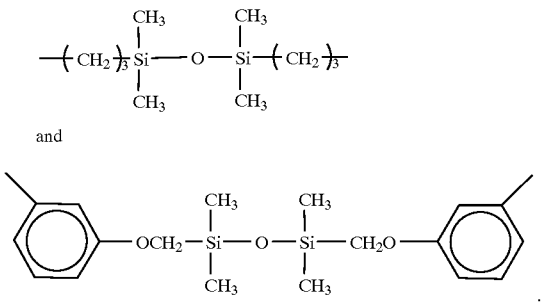

Any of these may be used alone or in combination of two or more.

In the general formula (1), Z's each consist of from 10 to 80 mol %, and preferably from 30 to 50 mol %, of a monovalent group represented by the formula (5), containing an acrylic or methacrylic group and the balance (i.e., from 90 to 20 mol %, and preferably from 70 to 50 mol %) being hydrogen atoms. If the group of the formula (5) is in an amount less than 10 mol %, no sufficient photosensitivity can be attained. If on the other hand it is in an amount more than 80 mol %, film properties after photocuring, in particular, film strength may lower.

The component-(A) polyimide precursor may have a weight-average molecular weight of usually from 10,000 to 150,000, and preferably from 20,000 and 80,000. If it has a too small weight-average molecular weight, film properties after curing may lower. If on the other hand it has a too large weight-average molecular weight, a poor operability may result when the composition of the present invention is coated on a base material by coating means such as spin coating.

The component-(A) polyimide precursor can be produced, e.g., in the following way.

A tetracarboxylic dianhydride represented by the general formula (6):

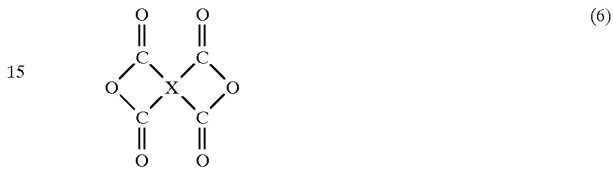

wherein X is as defined previously; and a diamine component represented by the general formula (7):

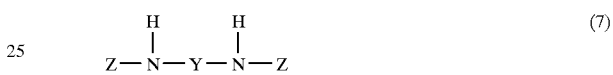

wherein Y and Z are as defined previously; are charged into a solvent such as N-methyl-2-pyrrolidone, dimethylacetamide, γ-butyrolactone or cyclohexanone, and they are allowed to react at room temperature to synthesize the polyimide precursor.

Here, the diamine component may be used in a proportion ranging from 0.95 to 1.05, and preferably from 0.98 to 1.02, in molar ratio with respect to the tetracarboxylic dianhydride component.

As examples of the tetracarboxylic dianhydride component of the general formula (6), it may include 3,3',4,4'-biphenyltetracarboxylic dianhydride, 2,2-bis(3,4-benzenedicarboxylic anhydride)perfluoropropane, 1,3-bis(3,4-dicarboxyphenyl)-1,1,3,3-tetramethyldisiloxane dianhydride, pyromellitic dianhydride, benzophenonetetracarboxylic dianhydride, 2,2-bis[4-(3,4-dicarboxyphenoxy)phenyl]propane dianhydride, and bis(3,4-dicarboxyphenyl) dimethylsilane dianhydride.

As examples of the diamine of the general formula (7), it may include aromatic ring-containing diamines such as p-phenylenediamine, m-phenylenediamine, 4,4'-diaminodiphenylmethane, 4,4'-diaminodiphenyl ether, 2,2'-bis(4-aminophenyl)propane, 4,4'-diaminodiphenyl sulfone, 4,4'-diaminodiphenyl sulfide, 1,4-bis(3-aminophenoxy)benzene, 1,4-bis(4-aminophenoxy)benzene, 1,4-bis(p-aminophenylsulfonyl)benzene, 1,4-bis(m-aminophenylsulfonyl)benzene, 1,4-bis(p-aminophenyl thioether)benzene, 1,4-bis(m-aminophenyl thioether)benzene, 2,2-bis[4-(4-aminophenoxy)phenyl]propane, 2,2-bis[3-methyl-4-(4-aminophenoxy)phenyl]propane, 2,2-bis[3-chloro-4-(4-aminophenoxy)phenyl]propane, 1,1-bis[4-(4-aminophenoxy)phenyl]ethane, 1,1-bis[3-methyl-4-(4-aminophenoxy)phenyl]ethane, 1,1-bis[3-chloro-4-(4-aminophenoxy)phenyl]ethane, 1,1-bis[3,5-dimethyl-4-(4-aminophenoxy)phenyl]ethane, bis[4-(4-aminophenoxy)phenyl]methane, bis[3-methyl-4-(4-aminophenoxy)phenyl]methane, bis[3-chloro-4-(4-aminophenoxy)phenyl]methane, bis[3,5-dimethyl-4-(4-aminophenoxy)phenyl]methane, bis[4-(4-aminophenoxy)phenyl] sulfone, and 2,2-bis[4-(4-aminophenoxy)phenyl]perfluoropropane; diamines having a nuclear substituent amide group, represented by the following formulas;

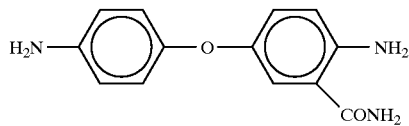

and

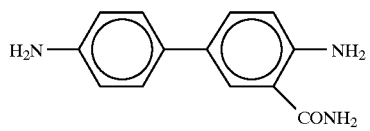

and siliconediamines represented by the following formulas.

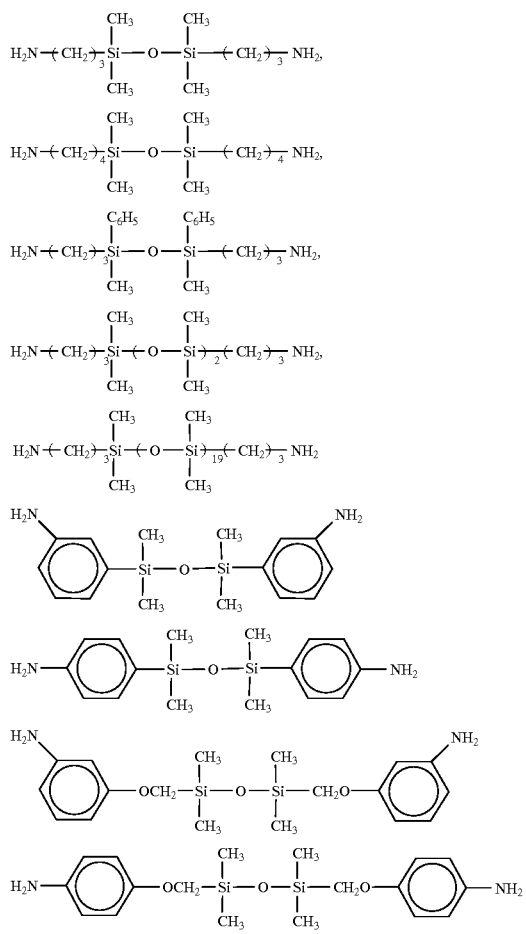

Of the above diamine compounds, those having an acrylic or methacrylic group can be readily obtained by reacting a diamine with a glycidyl group-containing acrylate or methacrylate. This glycidyl group-containing acrylate or methacrylate may include, e.g., glycidyl methacrylate.

Component (B):

The component (B) is the tertiary amine compound represented by the general formula (8), and has the function to improve the photosensitivity of the composition of the present invention.

The monovalent organic group having 3 or less carbon atoms (i.e., 1 to 3 carbon atoms), represented by $R^6$, may include a methyl group, an ethyl group or a propyl group. It may preferably be a methyl group and an ethyl group.

The divalent organic group having 3 or less carbon atoms (i.e., 1 to 3 carbon atoms), represented by $R^7$, may include an ethylene group and a propylene group.

$R^8$ is a hydrogen atom or a methyl group.

As examples of the tertiary amine compound, it may include diethylaminoethyl methacrylate and dimethylaminopropyl methacrylate. These may be used singly or in combination.

The component (B) may be mixed normally, in an amount of from 20 to 80 mol %, and preferably from 20 to 50 mol %, based on all carboxylic acid groups of the component (A). If the component (B) is in a too small amount, the photosensitivity can not be well improved. If on the other hand it is in a too large amount, the film properties after curing may deteriorate.

Component (C):

The component (C) is at least one of a photopolymerization initiator and a sensitizer.

The photopolymerization initiator may include, e.g., benzoin isopropyl ether, 2-methyl-[4-(methylthio)phenyl]-2-morpholino-1-propanone, 1-phenyl-1,2-butanedion-2-(o-methoxycarbonyl)oxime, N-phenylglycine, 3-phenyl-5-isoxazolone, and biimidazole compounds.

The sensitizer may include, e.g., ethyl p-benzoate, carbonylbis(diethylaminocumarine), benzophenone, acetophenone, anthrone, phenanethrene, nitrofluorene, nitroacenaphthene, p,p'-tetramethyldiaminobenzophenone, chlorothioxanthone, benzanthraquinone, 2,6-bis-(4-diethylaminobenzal)-cyclohexanone, 2,6-bis-(4-diethylaminobenzal)-4-methyl-cyclohexanone, 4,4'-bis (diethylamino)chalcone, 2,4-diethylthioxanthone, N-phenyl-diethanolamine, cumarine compound benzyl, 1-hydroxy-cyclohexyl-phenyl ketone, and camphorquinone. Any of these may be used alone or in combination of two or more.

The component (C) may be mixed in an amount of usually from 0.1 to 20% by weight, and preferably in the range from 0.5 to 10% by weight, based on the total weight of the components (A) and (B). If the component (C) is in a too small amount, the photosensitivity can not be well attained. On the other hand, its use in a too large amount may cause a decrease in photosensitivity and also may make film properties poor.

Solvent:

A solvent may be added to the photosensitive resin composition of the present invention in order to, e.g., make it easy to coat the composition on the base material. It may include, e.g., N-methyl-2-pyrrolidone, dimethylacetamide, dimethylformamide, hexamethylphosphoroamide, tetrahydrofuran, 1,4-dioxane, methyl cellosolve, butyl cellosolve, diethylene glycol dimethyl ether, diethylene glycol diethyl ether, triethylene glycol dimethyl ether, acetone, methyl ethyl ketone, methyl isobutyl ketone, cyclopentanone, cyclohexanone, γ-butyrolactone, butyl cellosolve acetate, toluene, xylene, anisole, methyl anisole, and ethyl phenyl ether. It may preferably be N-methyl-2-pyrrolidone. Any of these may be used alone or in combination of two or more.

The solvent may be used in such an amount that the component-(A) polyimide precursor may be in an amount of preferably from 3 to 60% by weight, and more preferably from 5 to 50% by weight, based on the weight of the solvent.

Preparation of photosensitive resin composition:

The photosensitive resin composition of the present invention can be readily prepared by mixing the components (A) to (C) optionally together with the solvent.

Production of polyimide patterns:

The photosensitive resin composition obtained as described above is coated on a base material such as a silicone wafer, a metal plate, a glass plate or a ceramic plate by a known coating method such as spin coating, dipping or printing, followed by drying by means of a dryer, a hot plate or the like to form a coating film on the base material.

The coating film may have a thickness, which depends on its uses, of usually from 5 to 40 $\mu$m, and preferably from 5 to 30 $\mu$m.

The coated base material may be dried at a temperature, which depends on the solvent used, of usually from 30 to 180° C. and for a time of from 1 to 30 minutes.

Next, a mask is placed on the coating film, and the coating film is exposed to light such as visible light or ultraviolet light. It may be exposed for a time, which depends on the type of light, the layer thickness, the uses and so forth, of usually from 10 seconds to 1 minute.

The coating film exposed to light is developed in an aqueous alkali solution, followed by rinsing to obtain a relief pattern.

The aqueous alkali solution may include, e.g., aqueous solutions of alkali metals such as sodium hydroxide and potassium hydroxide; ammonium hydroxide, and quaternary ammonium hydroxides such as tetramethylammonium hydroxide and tetrabutylammonium hydroxide; and aqueous solutions of organic amines such as methyldiethanolamine and triethanolamine. It may preferably be an aqueous tetramethylammonium hydroxide solution.

The developing solution may have a concentration of usually from 0.01 to 30% by weight, and preferably from 0.5 to 3.0% by weight.

The relief pattern thus obtained is heated in a dryer or an electric furnace to effect imidization to form a polyimide pattern. It may be heated at a temperature ranging usually from 200 to 500° C., and preferably from 300 to 400° C., and may be heated for a time of from 0.5 to 1 hour.

Cured films or patterns obtained by subjecting the photosensitive resin composition of the present invention to photopolymerization followed by imidization are widely usable in, e.g., junction coat films, passivation films and buffer coat films on the surfaces of semiconductor devices such as diodes, transistors, ICs and LSIs, $\alpha$-ray screening films of LSIs or the like, interlayer insulation films of multi-layer wiring, conformal coatings of printed circuit boards, alignment films of liquid-crystal devices, and ion implantation masks.

EXAMPLES

The present invention will be described below in greater detail by giving Examples. In the following, viscosity is indicated as a value at 25° C.

Synthesis Example 1

Into a flask having a stirrer, a thermometer and a nitrogen replacement device, 40.04 g (200 mmol) of 4,4'-diaminodiphenyl ether, 34.08 g (240 mmol) of glycidyl methacrylate and 380 g of N-methyl-2-pyrrolidone were charged, and the temperature was raised to 80° C., followed by stirring at the same temperature for 20 hours to carry out reaction. After the stirring, the solution was cooled to room temperature.

Next, the resultant reaction solution was analyzed by gel permeation chromatography to confirm the disappearance of glycidyl methacrylate and the formation of an adduct of 4,4'-diaminodiphenyl ether with one molecule of glycidyl methacrylate and another one with two molecules of glycidyl methacrylate.

To this reaction solution, 79.96 g (180 mmol) of 2,2-bis (3,4-benzenedicarboxylic anhydride)perfluoropropane and 8.52 g (20 mmol) of 1,3-bis(3,4-dicarboxyphenyl)-1,1,3,3-tetramethyldisiloxane dianhydride were added while cooling the system so as not to make the reaction temperature higher than 30° C.

After the addition, the mixture was stirred at room temperature for 10 hours to obtain a polyimide precursor (1). The viscosity of this compound was measured to find that it was 4,500 cP. The polyimide precursor (1) is a compound having the general formula (1) in which Z consists of 60 mole % of the group: —$CH_2$—$CH(OH)$—$CH_2O$—$CO$—$C(CH_3)$=$CH_2$ and 40 mole % of hydrogen atoms, and X consists of the group of the formula (2)-1 and the group of the formula (2)-2.

Synthesis Example 2

Into a flask having a stirrer, a thermometer and a nitrogen replacement device, 39.60 g (200 mmol) of 4,4'-diaminodiphenylmethane, 17.04 g (120 mol) of glycidyl methacrylate and 300 g of N-methyl-2-pyrrolidone were charged, and the temperature was raised to 80° C., followed by stirring at the same temperature for 20 hours to carry out reaction. After the stirring, the solution was cooled to room temperature.

To this reaction solution, 29.42 g (100 mmol) of 3,3',4,4'-biphenyltetracarboxylic dianhydride and 42.60 g (100 mmol) of 1,3-bis(3,4-dicarboxyphenyl)-1,1,3,3-tetramethyldisloxane dianhydride were added while cooling the system so as not to make the reaction temperature higher than 30° C.

After the addition, the mixture was stirred at room temperature for 10 hours to obtain a polyimide precursor (2). The viscosity of this compound was measured to find that it was 4,000 cP. The polyimide precursor (2) is a compound of the general formula (1) in which Z consists of 30 mole % of the group: —$CH_2$—$CH(OH)$—$CH_2O$—$CO$—$C(CH_3)$=$CH_2$ and 70 mole % of hydrogen atoms, and X consists of the group of the formula (2)-2 and the group of the formula (2)-3.

Synthesis Example 3

Into a flask having a stirrer, a thermometer and a nitrogen replacement device, 36.04 g (180 mmol) of 4,4'-diaminodiphenyl ether, 11.36 g (80 mmol) of glycidyl methacrylate and 290 g of N-methyl-2-pyrrolidone were charged, and the temperature was raised to 80° C., followed by stirring at the same temperature for 20 hours to carry out reaction. After the stirring, the solution was cooled to room temperature.

To this reaction solution, 4.97 g (20 mmol) of 1,3-bis[3-aminopropyl]-1,1,3,3-tetramethyldisiloxane was added, and 53.28 g (120 mmol) of 2,2-bis(3,4-benzenedicarboxylic anhydride)perfluoropropane and 17.45 g (80 mmol) of pyromellitic dianhydride were further added while cooling the system so as not to make the reaction temperature higher than 30° C.

After the addition, the mixture was stirred at room temperature for 10 hours to obtain a polyimide precursor (3). The viscosity of this compound was measured to find that it was 5,200 cP. The polyimide precursor (3) is a compound having the general formula (1) in which Z consists of 20 mole % of the group: —$CH_2$—$CH(OH)$—$CH_2O$—$CO$—$C$ $(CH_3)=CH_2$ and 80 mole % of hydrogen atoms, and X consists of 60 mole % of the group of the formula (2)-1 and 40 mole % of the group:

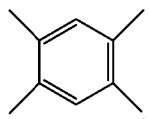

Synthesis Example 4

Into a flask having a stirrer, a thermometer and a nitrogen replacement device, 40.04 g (200 mmol) of 4,4'-diaminodiphenyl ether, 34.08 g (240 mmol) of glycidyl methacrylate and 380 g of N-methyl-2-pyrrolidone were charged, and the temperature was raised to 80° C., followed by stirring at the same temperature for 20 hours to carry out reaction. After the stirring, the solution was cooled to room temperature.

To this reaction solution, 26.64 g (60 mmol) of 2,2-bis(3,4-benzenedicarboxylic anhydride)perfluoropropane and 30.52 g (140 mmol) of pyromellitic dianhydride were added while cooling the system so as not to make the reaction temperature higher than 30° C.

After the addition, the mixture was stirred at room temperature for 10 hours to obtain a polyimide precursor (4). The viscosity of this compound was measured to find that it was 5,100 cP. The polyimide precursor (4) is a compound of the general formula (1) in which Z consists of 60 mole % of the group: $-CH_2-CH(OH)-CH_2O-CO-C(CH_3)=CH_2$ and 40 mole % of hydrogen atoms, and X consists of 30 mole % of the group having the formula (2)-1 and 70 mole % of the group:

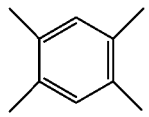

Synthesis Example 5

Into a flask having a stirrer, a thermometer and a nitrogen replacement device, 40.04 g (200 mmol) of 4,4'-diaminodiphenyl ether, 2.84 g (20 mmol) of glycidyl methacrylate and 380 g of N-methyl-2-pyrrolidone were charged, and the temperature was raised to 80° C., followed by stirring at the same temperature for 20 hours to carry out reaction. After the stirring, the solution was cooled to room temperature.

To this reaction solution, 79.96 g (180 mmol) of 2,2-bis(3,4-benzenedicarboxylic anhydride)perfluoropropane and 8.52 g (20 mmol) of 1,3-bis(3,4-dicarboxyphenyl)-1,1,3,3-tetramethyldisloxane dianhydride were added while cooling the system so as not to make the reaction temperature higher than 30° C.

After the addition, the mixture was stirred at room temperature for 10 hours to obtain a polyimide precursor (5). The viscosity of this compound was measured to find that it was 7,100 cP. The polyimide precursor (5) is a compound of the general formula (1) in which Z consists; of 5 mole % of the group having $-CH_2-CH(OH)-CH_2O-CO-C(CH_3)=CH_2$ and 95 mole % of hydrogen atoms, and X consists of the group of the formula (2)-1 and the group of the formula (2)-2.

Examples 1 to 6

Comparative Examples 1–3

In these Examples, the components (A) to (C) were mixed in the particulars and amounts as shown in Table 1 to prepare photosensitive resin compositions. In Table 1, "part(s)" refers to "part(s) by weight".

TABLE 1

| | (A) Polyimide precursor (parts) | | (B) Tertiary amine compound (parts) | | (C) Photopolymerization initiator/sensitizer (parts) | |
|---|---|---|---|---|---|---|
| Ex. 1 | ① | 100 | Dimethylaminopropyl methacrylate | 3.8 | Camphorquinone<br>Ethyl p-dimethylbenzoate | 1.2<br>1.5 |
| Ex. 2 | ① | 100 | Dimethylaminopropyl methacrylate | 3.8 | 2-Methyl [4-(methylthio)phenyl]-2-morpholino-1-propane<br>2,4-Diethylthioxanthone | 1.2<br><br><br><br><br>0.3 |
| Ex. 3 | ② | 100 | Methylaminoethyl methacrylate | 10.4 | 2,6-Bis(4-diethylaminobenzal)-4-methyl-cyclohexanone<br>N-phenylglycine | 0.2<br><br><br><br><br>1.2 |
| Ex. 4 | ② | 100 | Methylaminoethyl methacrylate | 10.4 | Carbonylbis (diethylaminocumarine)<br>N-phenylglycine | 0.2<br><br><br>1.2 |
| Ex. 5 | ③ | 100 | Methylaminoethyl methacrylate | 12.5 | 2,4-Diethylthioxanthone<br>3-Phenyl-5-isoxazolone | 0.2<br><br>1.2 |
| Ex. 6 | ③ | 100 | Methylaminoethyl methacrylate | 12.5 | Carbonylbis (diethylaminocumarine)<br>3-Phenyl-5 isoxazolone | 0.2<br><br><br>1.2 |
| Comp. Ex. 1 | ④ | 100 | Dimethylaminopropyl methacrylate | 3.8 | Camphorquinone<br>Ethyl p-dimethylaminobenzoate | 1.2<br>1.5 |
| Comp. Ex. 2 | ⑤ | 100 | Dimethylaminopropyl methacrylate | 3.8 | Camphorquinone<br>Ethyl p-dimethylaminobenzoate | 1.2<br>1.5 |
| Comp. Ex. 3 | ① | 100 | — | — | Camphorquinone<br>Ethyl p-dimethylaminobenzoate | 1.2<br>1.5 |

In these Examples, the photosensitive resin compositions were each coated on silicon wafers by means of a spin coater, followed by drying for 4 minutes on a 90° C. hot plate to form coating films.

A photomask having a stripe pattern was brought into close contact with each of the coating films thus formed, followed by exposure to ultraviolet light for 60 seconds using a 250 W ultrahigh-pressure mercury lamp.

After the exposure, the coating films were developed for 1 minute in an aqueous 2.3% by weight tetramethylammonium hydroxide (TMAH) solution or an aqueous 0.5N KOH solution, followed by rinsing with pure water to form patterns.

Shapes and minimum line width of the patterns (line-and-space patterns) thus formed were observed to evaluate developability in aqueous alkali solutions. Results obtained are shown in Table 2.

Next, base materials on which the patterns were formed were put into a dryer, and heated at a temperature of 150° C. for 30 minutes and further at a temperature of 350° C. for 1 hours to effect imidization to obtain polyimide patterns.

Adhesion of the polyimide patterns to the base materials was examined by a cross cut test (JIS 5400). Results obtained are shown in Table 2.

TABLE 2

| | Developability (TMAH) | | Developability (KOH) | | Adhesion Cross cut test | Layer thickness ($\mu$m) |
|---|---|---|---|---|---|---|
| | Pattern shape | Resolution ($\mu$m) | Pattern shape | Resolution ($\mu$m) | | |
| Ex. 1 | Good | 40 | Good | 40 | 100/100 | 6.5 |
| Ex. 2 | Good | 30 | Good | 30 | 100/100 | 7.0 |
| Ex. 3 | Good | 30 | Good | 30 | 100/100 | 7.5 |
| Ex. 4 | Good | 30 | Good | 30 | 100/100 | 7.5 |
| Ex. 5 | Good | 30 | Good | 30 | 100/100 | 7.0 |
| Ex. 6 | Good | 20 | Good | 20 | 100/100 | 7.5 |
| Comp. Ex. 1 | Crack formed in the pattern | 60 | Crack formed in the pattern | 80 | 0/100 | 6.0 |
| Comp. Ex. 2 | Completely dissolved to form no pattern | — | Completely dissolved to form no pattern | — | Impossible to measure | Impossible to measure |
| Comp. Ex. 3 | Crack formed in the pattern | 50 | Crack formed in the pattern | 60 | 100/100 | 6.0 |

What is claimed is:

1. A photosensitive resin composition comprising;

(A) a polyimide precursor having a repeating unit represented by the general formula (1):

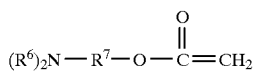

wherein X is a tetravalent aromatic residual group containing at least 50 mol % of a group selected from the group consisting of groups represented by the formulas (2)-1 to (2)-3:

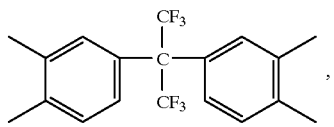

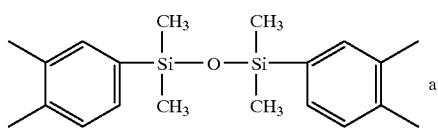

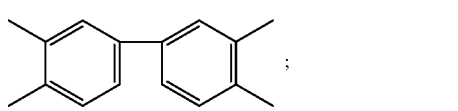

Y is at least one member selected from the group consisting of a divalent organic group having an aromatic ring and a divalent organic group having a siloxane linkage; Z's each consist of from 10 to 80 mol % of a monovalent group represented by the formula (5):

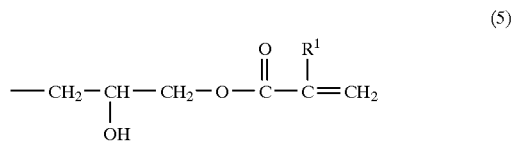

wherein $R^1$ is a hydrogen atom or a methyl group and from 90 to 20 mol % of a hydrogen atom;

(B) a tertiary amine compound represented by the general formula (8):

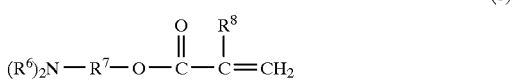

wherein $R^6$ is a monovalent organic group having 3 or less carbon atoms, $R^7$ is a divalent organic group having 3 or less carbon atoms, and $R^8$ is a hydrogen atom or a methyl group; and (C) a photopolymerization initiator, a sensitizer or a mixture thereof.

2. The composition of claim 1, wherein in the tetravalent organic group represented by X in the general formula (1), the group selected from the group consisting of groups represented by the formulas (2)-1 to (2)-3 comprises 70 to 100 mol %.

3. The composition of claim 1, wherein the divalent organic group having an aromatic ring represented by Y is a group represented by the formula (3):

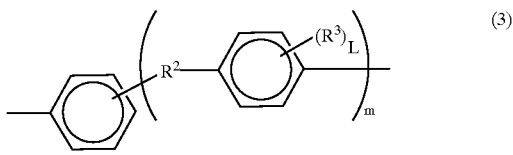

wherein $R^2$ is independently a group of —$CH_2$—, —$C(CH_3)_2$—, —$C(CH_3)$—, —$C(CF_3)_2$—, —S—, —$SO_2$— a or —O—; $R^3$ is independently a hydrogen atom, a methyl group or a halogen atom; L is 1 or 2; and m is an integer of 0 to 3.

4. The composition of claim 1, wherein the divalent organic group having an aromatic ring represented by Y is represented by the following formulas:

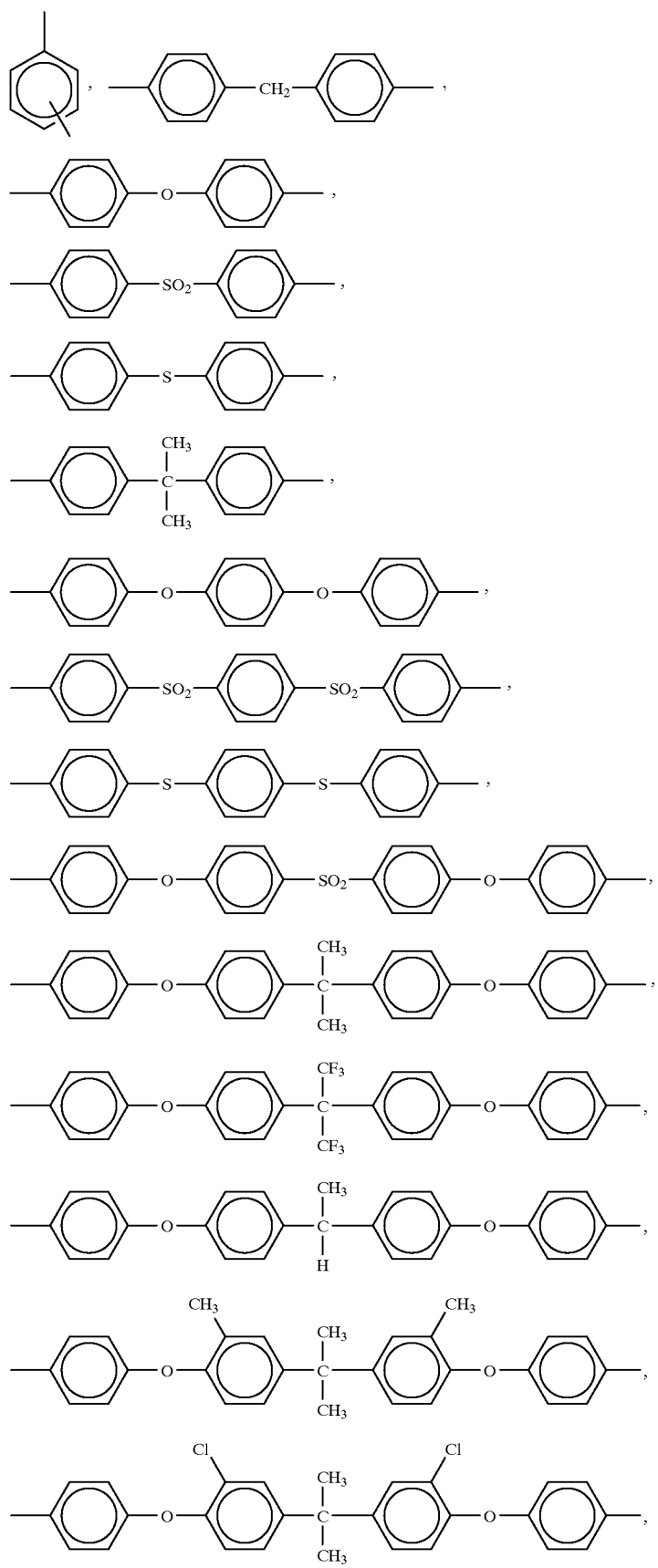

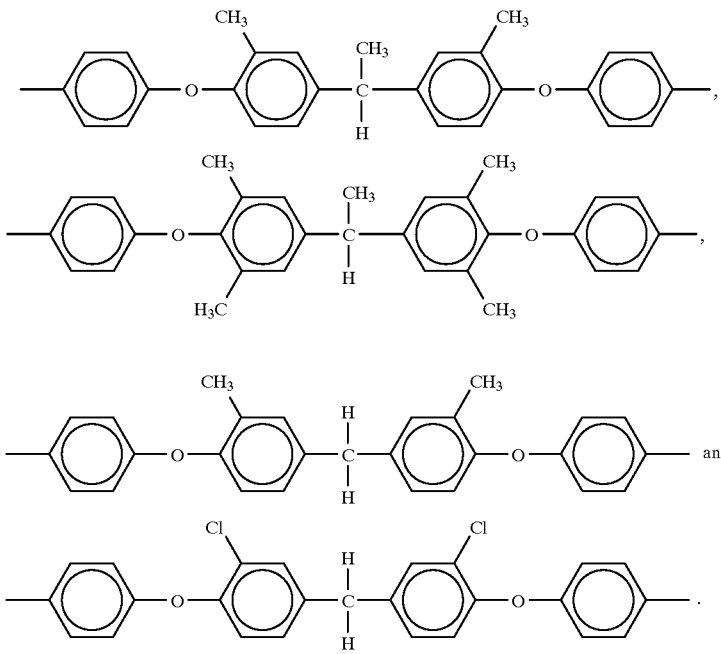

5. The composition of claim 1, wherein the divalent organic group having a siloxane linkage is represented by the general formula (4):

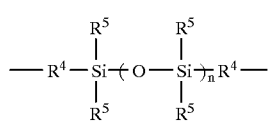
(4)

wherein $R^4$'s are each a divalent organic group, $R^5$'s are each a divalent hydrocarbon group, and n is an integer of from 1 to 20.

6. The composition of claim 1, wherein the divalent organic group having a siloxane linkage is represented by the following formulas:

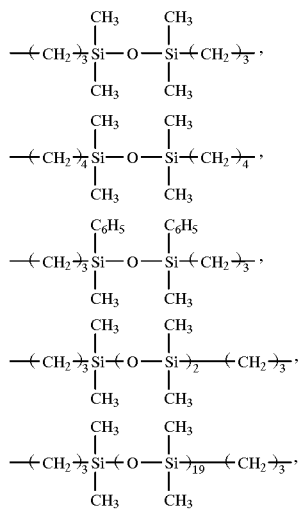

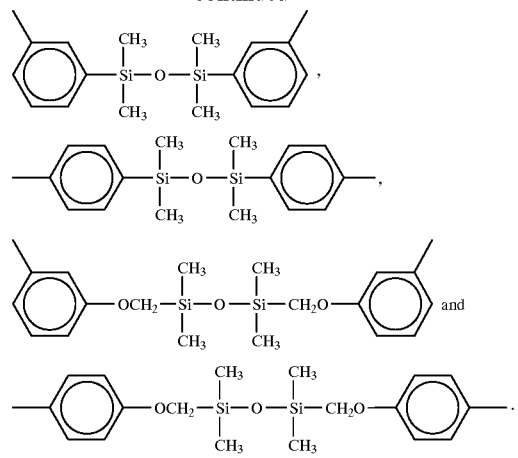

7. The composition of claim 1, wherein in the general formula (1), Z's each consist of from 30 to 50 mol % of a monovalent group represented by the formula (5) and from 70 to 50 mol % of hydrogen atoms.

8. The composition of claim 1, wherein the polyimide precursor of the component (A) has a weight average molecular weight of 10,000 to 150,000.

9. The composition of claim 1, wherein the tertiary amine compound of the component (B) comprises a compound selected from the group consisting of diethylaminoethyl methacrylate and dimethylaminopropyl methacrylate.

10. The composition of claim 1, wherein the component (B) is present in an amount of 20 to 80 mol % based on all the carboxylic acid groups contained in the component (A).

11. The composition of claim 1, wherein the component (C) is present in an amount of 0.1 to 20% by weight based on the total weight of the components (A) and (B).

12. The composition of claim 1, further composing a solvent.

13. The composition of claim 12, wherein the solvent is present in an amount of 3 to 60% by weight based on the polyimide precursor of the component (A).

14. A process for producing a polyimide patterned film comprising the steps of:
   (1) coating a base material with the composition according to claim 1, followed by drying to form a coating film;
   (2) exposing the coating film thus formed, to light through a mask placed thereon;
   (3) developing the coating film having been exposed, in an aqueous alkali solution to form a pattern; and
   (4) heating the resultant pattern to effect polyimidization.

* * * * *